(12) United States Patent
Kolan et al.

(10) Patent No.: US 12,422,480 B1
(45) Date of Patent: Sep. 23, 2025

(54) DETECTING HARDWARE ERRORS

(71) Applicant: Amazon Technologies, Inc., Seattle, WA (US)

(72) Inventors: Tom Kolan, Haifa (IL); Adi Habusha, Alonei Abba (IL); Nicolas Worms, Haifa (IL); Ilan Wachtel, Mazkeret Batya (IL)

(73) Assignee: Amazon Technologies, Inc., Seattle, WA (US)

( * ) Notice: Subject to any disclaimer, the term of this patent is extended or adjusted under 35 U.S.C. 154(b) by 34 days.

(21) Appl. No.: 18/338,025

(22) Filed: Jun. 20, 2023

(51) Int. Cl.
*G01R 31/3183* (2006.01)
*G01R 31/3177* (2006.01)

(52) U.S. Cl.
CPC . *G01R 31/318385* (2013.01); *G01R 31/3177* (2013.01)

(58) Field of Classification Search
CPC ............... G06F 11/261; G06F 30/33; G01R 31/318385; G01R 31/3177
See application file for complete search history.

(56) References Cited

U.S. PATENT DOCUMENTS

| 8,868,976 | B2 * | 10/2014 | Ben-Yehuda | G06F 11/263 714/25 |
|---|---|---|---|---|
| 2009/0222694 | A1 * | 9/2009 | Adir | G06F 30/33 714/26 |
| 2021/0064471 | A1 | 3/2021 | Park et al. | |

OTHER PUBLICATIONS

Chian-Min Richard Ho, Validation Tools for Complex Digital Designs (Year: 1996).*
Validation Tools for Complex Digital Designs (Year: 1996).*
Udhakar Gummadi and Radhakrishnan Shanmugasundaram Journal of Computer Science 7 (6): 884-891, 2011 ISSN 1549-3636 © 2011 Science Publications Dynamic Allocation of CPUs in Multicore Processor for Performance Improvement in Network Security Applications (Year: 2011).*
Adir, A. et al., "Threadmill: A Post-Silicon Exerciser for Multi-Threaded Processors," DAC'11: Proc. of the 48th Design Automation Conference, Jun. 2011, pp. 860-865.
Dixit, H. et al., "Silent Data Corruptions at Scale," arXiv:2102. 11245v1 [cs.AR] preprint, Feb. 22, 2021, 8 pages.
Hochschild, P. H., "Cores that don't count," HotOS'21: Proc. of the Workshop on Hot Topics in Operating Systems, Jun. 2021, pp. 9-16.
U.S. Appl. No. 18/432,969, inventors Kolan T, et al., filed Feb. 5, 2024.

\* cited by examiner

*Primary Examiner* — Guerrier Merant
(74) *Attorney, Agent, or Firm* — Weaver Austin Villeneuve & Sampson LLP

(57) ABSTRACT

Hardware errors can be detected by generating a plurality of test templates to perform testing on an integrated circuit (IC) device. A set of random tests can be generated corresponding to the plurality of test templates. The set of random tests can be executed on the IC device for multiple passes, and the results of the multiple passes can be compared to detect the hardware error in the IC device. The set of random tests can be generated as a binary image for execution on the IC device. The IC device may include multiple processing cores, and executing the multiple passes may include changing logical role of each processing core between subsequent passes. The set of random tests can be executed in a bare-metal mode, or at an application level of the IC device.

20 Claims, 6 Drawing Sheets

| Binary Image 302 | Test 1-1 | Test 1-2 | . . . | Test 1-N |

| Binary Image 304 | Test 2-1 | Test 2-2 | . . . | Test 2-N |

| Binary Image 306 | Test 3-1 | Test 3-2 | . . . | Test 3-N |

FIG. 3

DETECTING HARDWARE ERRORS

BACKGROUND

Hardware errors are random defects in integrated circuits that can be caused by a variety of reasons such as manufacturing defects, or errors resulting from aging of the integrated circuits, or variance in the operating environment (e.g., temperature or voltage changes), among other factors. As the size and complexity of the integrated circuits increases, and the fabrication processes are pushed to their limits with ever growing number of processing cores in computing devices, the hardware errors are becoming a significant problem. For example, hardware errors can especially become a critical issue in the servers as the sizes of server fleet/on-premises farms explode to keep up with the demand, which can compromise the reliability and up-time of the servers.

BRIEF DESCRIPTION OF THE DRAWINGS

Various embodiments in accordance with the present disclosure will be described with reference to the drawings, in which:

FIG. 3 illustrates example binary images comprising multiple sets of random tests for testing the IC device, according to some embodiments;

DETAILED DESCRIPTION

Figure 1:
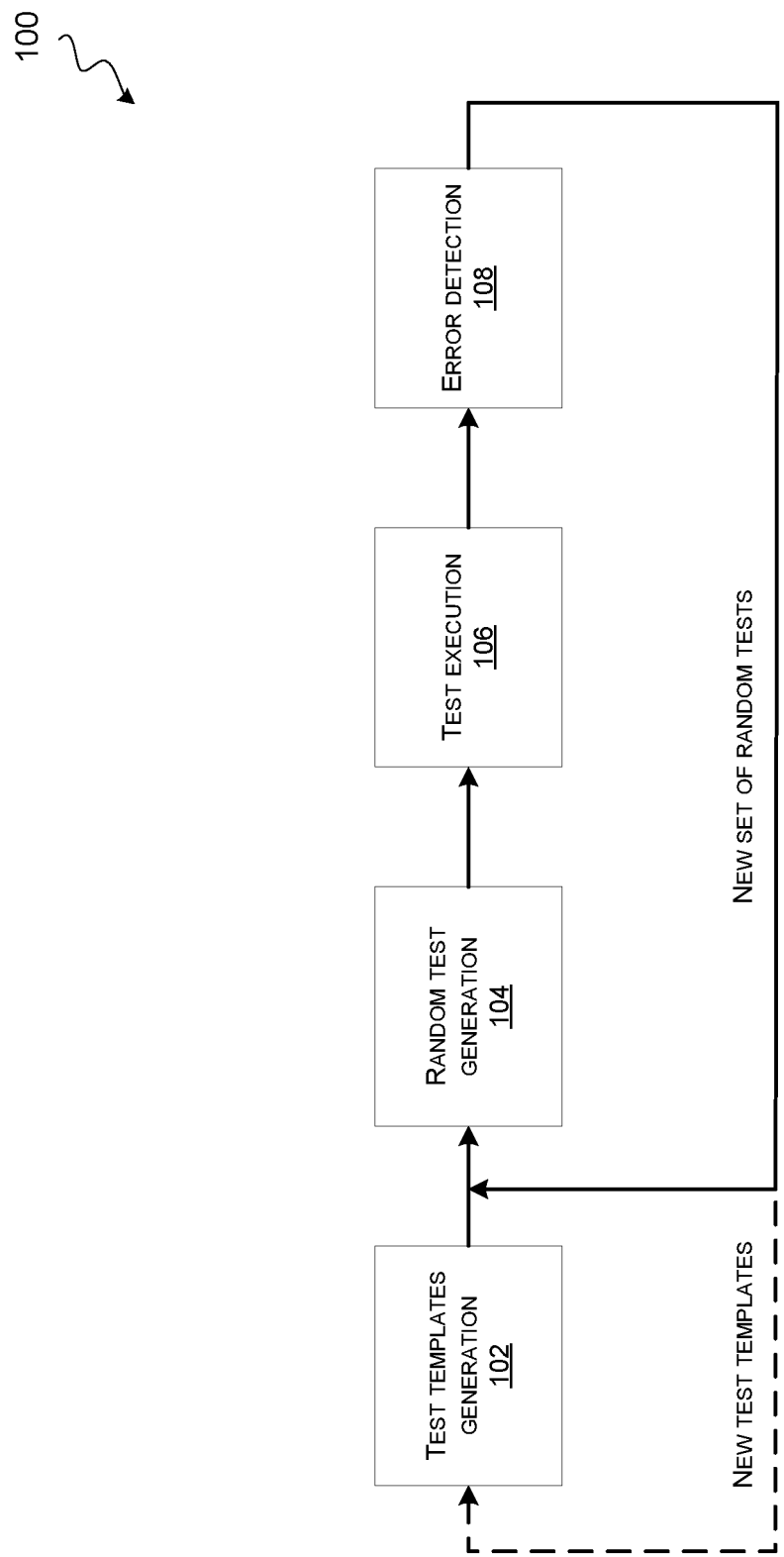
FIG. 1 illustrates an example flow for a process that can be performed to detect hardware errors in an integrated circuit (IC) device, according to some embodiments.

Hardware errors are random defects in manufactured integrated circuit (IC) devices, and are generally not logic or software errors. Hardware errors can be caused by a manufacturing defect, aging of the hardware circuits, or variance in the operating environment (e.g., voltage or temperature changes). In some cases, incomplete testing of the IC device prior to the deployment can also cause a defective IC device to be placed in the field. The IC devices may include system-on-chips (SoCs), or other computing devices that are part of a server. In some examples, the server can be part of a cloud provider fleet comprising a plurality of servers, and different types of hardware errors may exist in different servers.

Some hardware errors may include silent data corruption (SDC) in the IC devices that may cause an internal operation of the IC device to provide an erroneous result, and is generally not detected by the system since no exception or interrupt may be raised in this case. For example, the SDC may cause the result of an addition operation to be intermittently incorrect, which can be hard to detect. The erroneous result may be propagated to other operations that are dependent on the output of the addition operation, and can cause erratic behavior of the IC device. Thus, the SDC can cause data loss, atomicity problems, as well as security gaps, which can become a critical issue in a cloud provider fleet, and can compromise the reliability, up-time and reputation of their services.

In most cases, deterministic or pseudo-random tests are performed to detect the hardware errors. However, such tests can exhaust themselves relatively fast by not creating interesting stimuli after a certain period, and, therefore, can be limited in coverage. Thus, there is a need for better techniques to detect and mitigate hardware errors.

Systems and methods are described herein to detect hardware errors in an IC device using guided on-target random test-generation techniques that can provide more exhaustive coverage than the techniques that rely on deterministic or pseudo-random tests. The IC device may include a plurality of processing cores. For example, the IC device can be an accelerator, a graphic processing unit (GPU), a digital signal processor (DSP), a multi-processor, or any suitable computing device. In some embodiments, an on-target test generator can be used to generate directed random tests based on a plurality of test templates, execute the random tests on the IC device, and check the results to detect the hardware errors. Each of the plurality of test templates can be used to direct the test generator to create scenarios for the detection of hardware errors by directing the random test generation to specific set of instructions. As an example, each test template may include a set of instructions based on the architectural specification of the IC device, which can be used to generate random tests to test different error prone areas of the IC device, e.g., logic associated with floating point computations, execution pipelines, frequency changes, back-to-back instruction branches, etc.

In some embodiments, a binary image can be created (e.g., periodically) that includes a plurality of random tests corresponding to the plurality of test templates. For example, a random test for a test template can be generated by one or more of randomly selecting instructions from the set of instructions provided in the template, randomizing a sequence of instructions in the set of instructions, or randomizing input values for instructions in the set of instructions. Each binary image can be generated automatically with a new set of random tests using the plurality of test templates, and this process can be repeated indefinitely with an attempt to detect the hardware errors in the IC device with different sets of random tests in each iteration.

In some embodiments, a multi-pass consistency checking method can be used to detect the hardware errors by executing each binary image for M number of passes. For example, a binary image can be executed on the IC device once, and the end-of-test results are stored as golden results (e.g., register contents, memory contents, or other resources). Next, the binary image is executed M-1 more times (e.g., passes), and the end-of-test results for each of the passes can be compared with the golden results to identify mismatches indicating whether an error has occurred. This method may provide better detection of the SDCs, which can be intermittent or indeterministic in nature. In some embodiments, each pass may use a different permutation of the logical roles of the physical processing cores for generating and/or executing the random test cases. Thus, switching the logical roles of the physical processing cores between subsequent passes of the same test case can be used to expose a defective processing core, and provide better coverage for detection of the hardware errors. Additionally, one or more processing cores can be designated as error detecting cores that do not generate random tests, but merely wait to receive an error interrupt from other processing cores upon detecting a hardware error.

Some embodiments can provide flexibility in testing at the application level or bare-metal level based on the configuration of the system. In the bare-metal mode, an on-target test generator can be loaded on the IC device, which can allow the test generator to have the complete control of the IC device and execute at all exception levels. The bare-metal mode can provide a maximal utilization of the system by generating the random tests on-target, which can avoid loading time of the tests or execution of deterministic code. The application-level mode can allow the test-generator to run as an application on the IC device. Application-level testing can be used, for example, for in-field testing of a system when bare-metal access is not available, or feasible. Application-level testing can also be performed on a subset of processing cores while other processing cores are executing actual user workloads without any interference from execution of the application-level testing. Thus, the techniques described herein can be used to generate directed random tests that have the advantage of providing more exhaustive coverage while being directed to a certain error prone area. Furthermore, new and different scenarios can be covered as needed by defining new test templates to cover those scenarios and executing the corresponding random tests.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates an example flow for a process 100 that can be performed to detect hardware errors in an IC device, according to some embodiments. Some of the steps of the process 100 can be performed on an on-target test generator.

The process 100 may start at block 102 that includes test templates generation. In some embodiments, the test templates generation can be performed by defining a plurality of test templates that each includes a set of instructions to create scenarios for the detection of hardware errors. A scenario may correspond to a set of events that can expose a certain behavior of the IC device based on the execution of the set of instructions. In some examples, each test template may create a scenario that can cause stress in different targeted areas of the IC device to make those areas vulnerable to errors, e.g., logic areas of the IC device that involve floating point computations, execution pipelines, changes in operating frequency, or back-to-back instruction branches. The test templates can be generated using any suitable format that is compatible with the test generator. In some implementations, the test templates can be used to create scenarios using a set of instructions based on the architectural specification of the IC device, and a combination of basic programming constructs (e.g., sequence, select, repeat, etc.), sequencings controls, and different constraints. As an example, a set of events for a scenario may include execution of different floating-point computations in a sequence.

In block 104, the process 100 may perform random test generation to generate random tests based on the plurality of test templates. As an example, N number of random tests can be generated corresponding to N number of test templates. In some embodiments, a random test for a test template can be generated by one or more of randomly selecting instructions from the set of instructions provided in the test template, randomizing a sequence of instructions in the set of instructions, or randomizing input values for instructions in the set of instructions. For example, the random test may include different types of instructions in a random order, and/or random values of the data to be operated on by some of the instructions. As an example, a first random test may include instructions to perform back-to-back floating-point computations such as multiplication, addition, division, etc. Another random test may include instructions to cause stress in the execution pipelines in the IC device by performing back-to-back load and/or store operations that access memory locations. Another random test may include instructions to cause changes in the operating frequency of the IC device, e.g., by switching between different power saving modes. Another random test may include instructions to cause back-to-back instruction branches.

In block 106, the process 100 may perform test execution to execute the random tests on the IC device. The set of random tests can be executed on the IC device for multiple passes (e.g., M number of passes). In some embodiments, the test execution may include executing, for each of the M number of passes, a binary image that includes a plurality of random tests corresponding to the plurality of test templates. In some embodiments, executing the random tests for multiple passes may include changing the logical roles of the physical processing cores between subsequent passes of the same random test case. For example, the binary image may include proper initialization and checking to support different permutations of the processing cores in each of the M number of passes. In some embodiments, changing the logical role of each processing core between the subsequent passes may include designating which processing core is used as an error detection core. For example, one or more processing cores can be designated as error detection cores that may not generate/execute random tests, but merely wait to receive an error interrupt from other processing cores upon detecting a hardware error. The error detection cores may notify the host system to halt the error detection process upon receiving an error interrupt.

Test execution can be performed in a bare-metal mode, or in an application-level mode of the IC device based on the system configuration. In the bare-metal mode, the test generator can have complete control of the IC device, and the test execution can be performed using all the processing cores of the IC device. Thus, the bare-metal mode can provide a maximal utilization of the system by generating the random tests on-target, which can avoid loading time of the tests. The application-level mode can allow the test-generator to run as an application on the IC device, and may utilize only a subset of the processing cores of the IC device without impacting the other processing cores that are executing the actual user workloads.

In block 108, the process 100 may perform error detection to detect hardware errors in the IC device. In some embodiments, a multi-pass consistency checking method can be used to detect the hardware errors, which may include executing the same test case by a different processing core in each pass. For example, the code associated with the test case executed by a processing core in a first pass may be executed by a different processing core in a second pass, and so on. Thus, the internal states of the IC device may change between multiple passes due to different timing of events between passes, different state of initial cache state, and/or different assignment of opcodes to execution units, which can expose an underlying hardware error. In some implementations, results of a first pass of the multiple passes can be saved as golden results, e.g., values of memory, registers, or other resources. The error detection may include comparing results of each of the M-1 passes of the test execution with the golden results to detect the hardware errors. For example, any inconsistencies between the results of the golden pass and the results of the subsequent passes can be identified as a hardware error.

In some examples, the random test generation 104, test execution 106, and the error detection 108 can be repeated to generate multiple sets of random tests using the same test templates. Additionally, new test templates can be defined to create new scenarios, and the flow of the process 100 can be repeated indefinitely to perform the random test generation 104 to generate new random tests, test execution 106 to execute the new random tests, and the error detection 108 to detect the hardware errors. Thus, various embodiments can allow generation of multiple sets of random tests on the IC device, which can allow maximal utilization of the system and avoid loading time of the tests.

Figure 2:
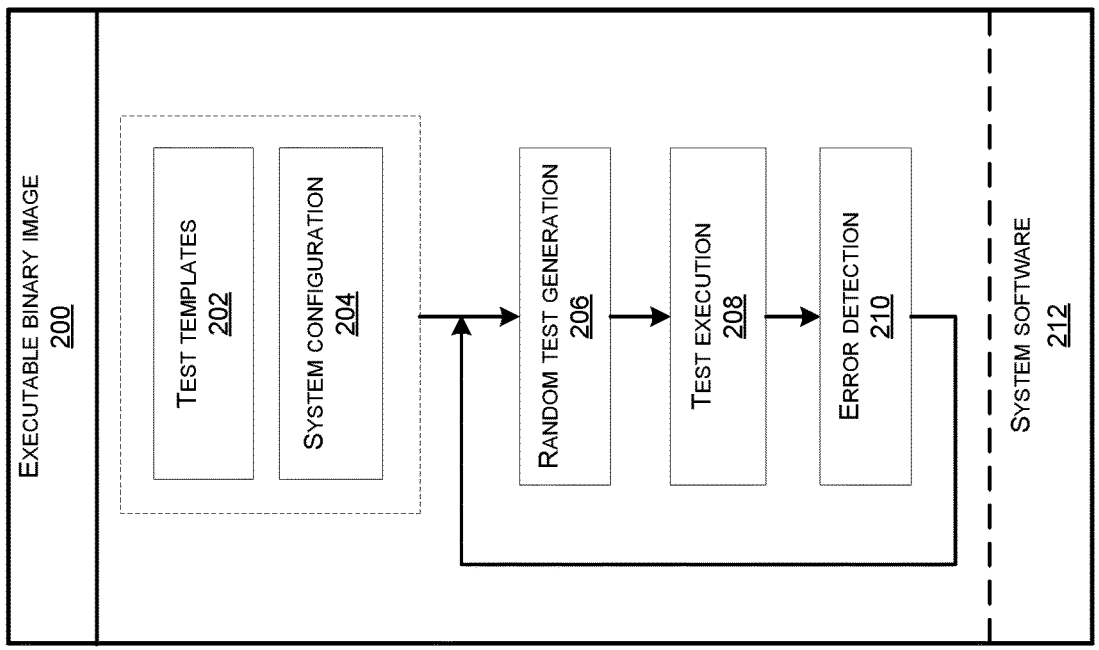
FIG. 2 illustrates an example of an executable binary image for the IC device to detect hardware errors, according to some embodiments.

FIG. 2 illustrates an example of an executable binary image 200 for an IC device to detect hardware errors, according to some embodiments. In some examples, a host system can be used to load the executable binary image 200 on the IC device to perform error detection.

In some embodiments, the executable binary image 200 can be loaded on the IC device for execution in the bare-metal mode. The bare-metal mode can allow the test generator to have the complete control of the IC device and execute in all exception levels. For example, the executable binary image 200 may include system software 212 to provide system level support, similar to an operating system, for execution in the bare-metal mode. The executable binary image 200 may also include data structures that are generated based on test templates 202, and a system configuration 204, which can be used to generate the on-target random tests. The test templates 202 may include a plurality of test templates to create scenarios for the detection of hardware errors as described in the block 104 for the process 100. The system configuration 204 may include the mode of execution (e.g., bare-metal or application-level), number of processing cores used for testing, number of passes (e.g., value of M), number of test templates (e.g., value of N), configuration of error detection cores, and seeds for randomization, among others.

The executable binary image 200 may also include code to perform test generation 206, test execution 208, and error detection 210 that can be repeated to generate multiple sets of random tests using the data structures to detect hardware errors in the IC device. The test generation 206, test execution 208, and the error detection 210 can be similar to the random test generation 104, test execution 106, and error detection 108 in FIG. 1, and can support on-target test generation for the IC device using the test templates. For example, each set of random tests can be generated corresponding to the test templates 202 by performing the test generation 206, and can be executed on the IC device for multiple passes by performing the test execution 208. Results of executing a first pass of the multiple passes can be stored as golden results. The error detection 210 can be performed to compare the golden results with results of the subsequent passes to detect the hardware errors by identifying any inconsistencies between the passes.

In some embodiments, performing the test generation 206, test execution 208, and the error detection 210 can be distributed among the processing cores of the IC device and the logical roles of the processing cores can be switched between subsequent passes of the same set of random tests. The error detection core doesn't have to generate random tests, but can merely wait for an error interrupt during test execution, which may be routed to the error detection core from the remaining processing cores. When the error detection core receives such an interrupt, it may report the interrupt to the host system to halt the test execution. In some embodiments, logical roles of the physical processing cores can be switched between subsequent passes of the same set of random tests. Thus, each pass may use a different permutation of the physical processing cores, which can expose a defective processing core, and provide better coverage for detection of the hardware errors.

In some embodiments, the executable binary image 200 may include code to repeatedly create a binary image with a new set of random tests using one or more test templates, and execute the new set of random tests on the IC device to detect the hardware errors. In some implementations, creation of the binary image can be performed periodically. The code can perform the test generation 206, test execution 208, and the error detection 210 to generate each binary image automatically with a new set of random tests for the given test templates. In some embodiments, the binary image can perform a round-robin of size N on the N number of test templates, e.g., test #i in the set of random tests can be generated from the template #(i MOD N). In some embodiments, a random test for a test template can be generated by one or more of randomly selecting instructions from the set of instructions, randomizing a sequence of instructions in the set of instructions, or randomizing input values for instructions in the set of instructions. This process can be repeated, for example, indefinitely, to test the IC device with different sets of random tests in each iteration, until a hardware error is detected, which can be used by the error detection core to halt the test execution.

FIG. 3 illustrates example binary images 300 comprising multiple sets of random tests for testing the IC device, according to some embodiments. Each of the example binary images 300 can be generated by performing the test generation 206 using the plurality of test templates.

The example binary images 300 may include a plurality of binary images comprising a binary image 302, a binary image 304, a binary image 306, and so on. Each of the binary images can be generated automatically with a new set of random tests corresponding to one or more test templates. For example, the binary image 302 may include a first set of random tests including a test 1-1, test 1-2, . . . , and a test 1-N corresponding to the N number of test templates, the binary image 304 may include a second set of random tests including a test 2-1, test 2-2, . . . , and a test 2-N corresponding to the N number of test templates, and the binary image 306 may include a third set of random tests including a test 3-1, test 3-2, . . . , and a test 3-N corresponding to the N number of test templates. Note that each of the binary images 300 can be executed for multiple passes with the same set of random tests and different permutations of logical roles of the physical processing cores in each pass, and the results of the execution can be used to detect hardware errors.

Figure 4:
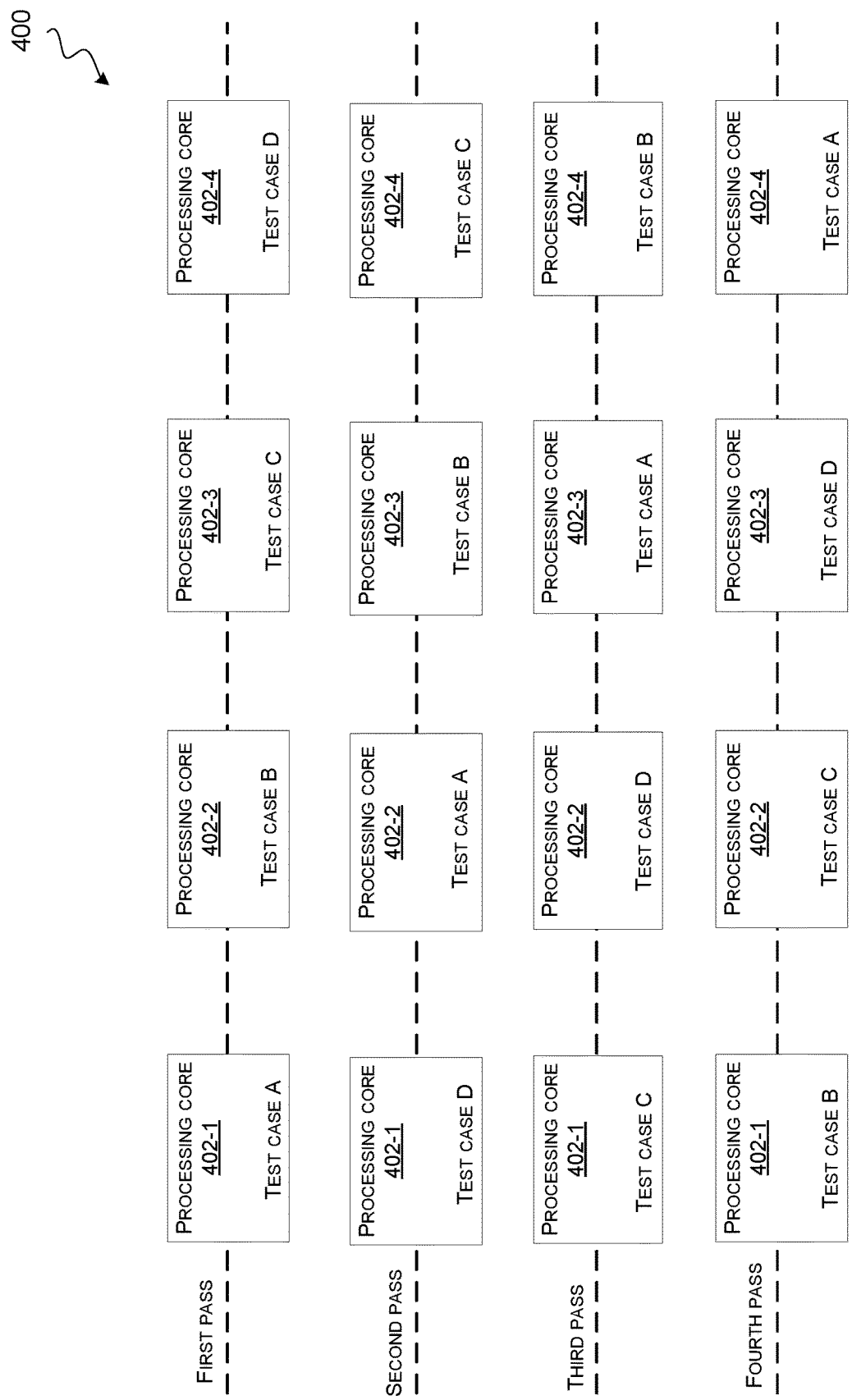
FIG. 4 illustrates an example of switching logical roles of the processing cores between subsequence passes of the same test case, in some embodiments.

FIG. 4 illustrates an example 400 of switching logical roles of four processing cores between subsequence passes of the same test case, in some embodiments.

FIG. 4 shows four processing cores comprising a processing core 402-1, a processing core 402-2, a processing core 402-3, and a processing core 402-4. Each of the four processing cores may be part of the IC device on which error detection is to be performed by the host system. Note that in other examples, the IC device may include fewer, or more than four processing cores based on the system specification. Each of the processing cores 402-1, 402-2, 402-3, and 402-4 may be configured to execute respective code associated with generation or execution of each of the random test cases in multiple passes.

In some examples, same set of random test cases may be executed in each pass of the multiple passes, but the logical roles of each of the processing cores 402-1, 402-2, 402-3, and 402-4 may be changed in the subsequent passes. For example, as shown in FIG. 4, in a first pass, the processing cores 402-1, 402-2, 402-3, and 402-4 may execute code associated with the random test cases A, B, C, and D, respectively. Results of execution of the random test cases A, B, C, and D by the processing cores 402-1, 402-2, 402-3, and 402-4 can be saved as golden results A, B, C, and D, respectively, at the end of the first pass. In the subsequent passes, logical roles of each of the processing cores 402-1, 402-2, 402-3, and 402-4 may be changed by having each of the processing cores 402-1, 402-2, 402-3, and 402-4 execute code corresponding to different test cases than executed in the previous passes.

For example, in a second pass, the processing core 402-1 may execute the code for the test case D that was executed by the processing core 402-4 in the first pass, the processing core 402-2 may execute the code for the test case A that was executed by the processing core 402-1 in the first pass, the processing core 402-3 may execute the code for the test case B that was executed by the processing core 402-2 in the first pass, and the processing core 402-4 may execute the code for the test case C that was executed by the processing core 402-3 in the first pass. Results of execution of the set of random test cases in the second pass can be compared with the golden results. For example, results of execution of the code for the test case D by the processing core 402-1 in the second pass can be compared with the golden results D from the first pass. Similarly, results of execution of the code for the test case A by the processing core 402-2 in the second pass can be compared with the golden results A from the first pass, results of execution of the code for the test case B by the processing core 402-3 in the second pass can be compared with the golden results B from the first pass, and results of execution of the code for the test case C by the processing core 402-4 in the second pass can be compared with the golden results C from the first pass.

Similarly, in a third pass and in a fourth pass, each of the processing cores 402-1, 402-2, 402-3, and 402-4 may execute different code than executed in the first pass and the second pass, and the results of execution may be compared with the respective golden results from the first pass. Any mismatches in the comparison of results against the golden results from the first pass may indicate occurrence of a hardware error. Note that once a mismatch is identified, the test execution may be stopped without completing all the subsequent passes. For example, if a mismatch is identified between the results of execution from the second pass against the golden results, the third pass and the fourth pass may not be executed.

In some embodiments, the IC device may include additional processing cores that can be designated as error detection cores, which do not have to generate/execute random test cases, but instead wait for a notification from the processing cores 402-1, 402-2, 402-3, and 402-4 upon detection of the hardware error. For example, the notification can be an error interrupt, which may be received by the error detection cores to halt the host system. In some embodiments, one or more of the processing cores 402-1, 402-2, 402-3, and 402-4 can be designated as the error detection cores, which may receive the error interrupt from the remaining processing cores upon detection of the hardware error.

In some embodiments, when the error detection is performed in an application-level mode, a subset of the processing cores 402-1, 402-2, 402-3, and 402-4 can be used to execute the on-target test generator as an application executing on the subset of processing cores to perform the test generation 206, test execution 208, and the error detection 210, while the remaining processing cores can execute the user workload without any impact from execution of the error detection process.

Figure 5:
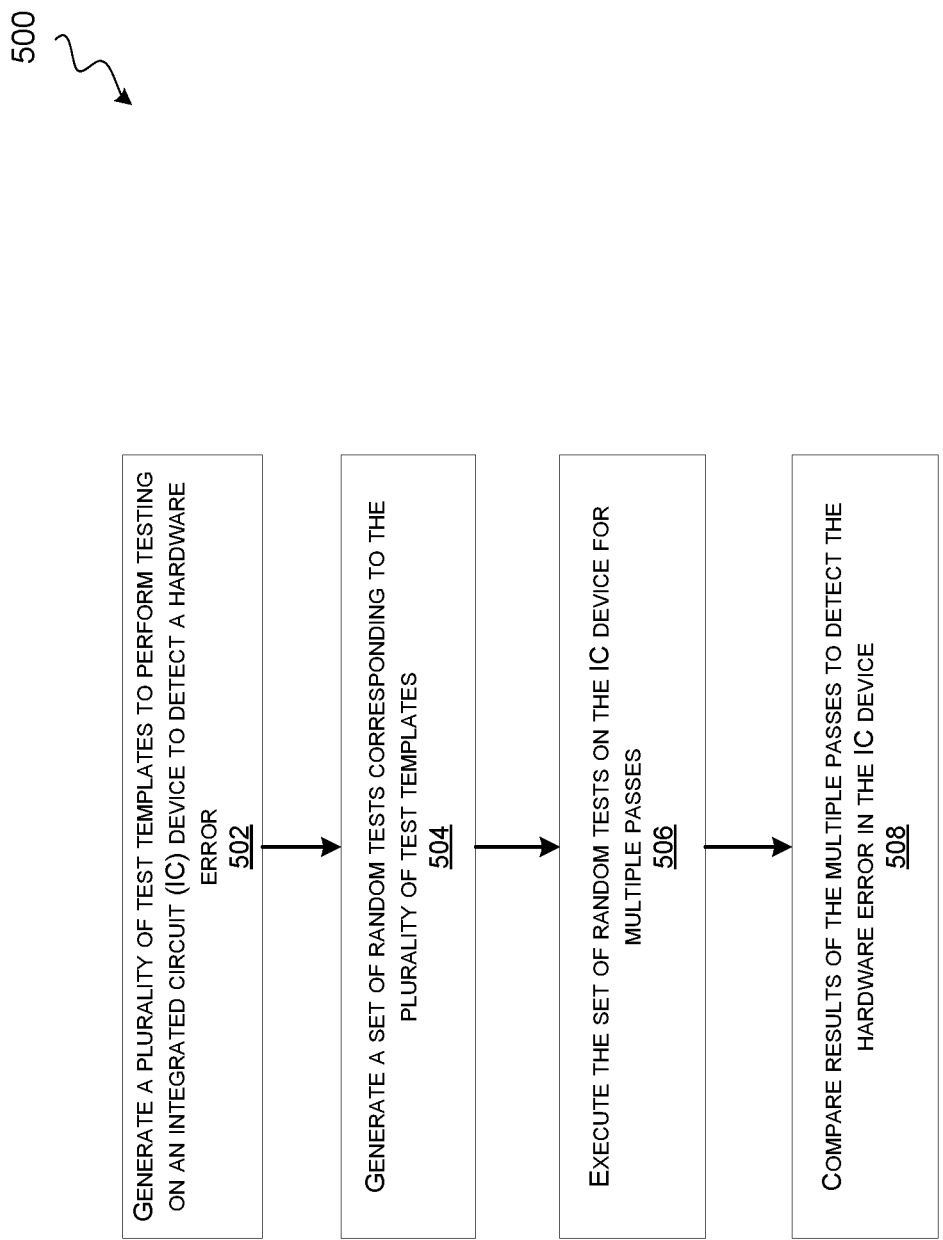
FIG. 5 illustrates an example flow chart for a method to detect hardware errors in the IC device, according to some embodiments.

FIG. 5 illustrates an example flow chart 500 for a method to detect hardware errors in an IC device, according to some embodiments. The method can be performed by a host system comprising one or more processors, memory, and other suitable components.

In step 502, the method includes generating a plurality of test templates to perform testing on an IC device to detect a hardware error. For example, the IC device may include the processing cores 402-1, 402-2, 402-3, and 402-4, as shown in FIG. 4. The plurality of test templates can be generated, as described with reference to the test templates generation block 102 in FIG. 1. Each test template may include a set of instructions to create scenarios for the detection of hardware errors that can cause stress in the targeted areas of the IC device. The test templates can be generated using a combination of basic programming constructs (e.g., sequence, select, repeat, etc.), sequencings controls, and different constraints on the set of instructions based on the architectural specification of the IC device.

In step 504, the method includes generating a set of random tests corresponding to the plurality of test templates. As described with reference to the random test generation block 104 in FIG. 1, N number of random tests can be generated corresponding to the N number of test templates. A random test for a test template can be generated by one or more of randomly selecting instructions from the set of instructions, randomizing a sequence of instructions in the set of instructions, or randomizing input values for instructions in the set of instructions. For example, a set of random tests corresponding to the plurality of test templates can be created to test one or more of floating-point computations, execution pipelines, frequency changes, and back-to-back instruction branches in the IC device.

In step 506, the method includes executing the set of random tests on the IC device for multiple passes. The set of random tests can be executed on the IC device for M number of passes as described in the test execution block 106 in FIG. 1. Each set of random tests is generated as a binary image for execution on the IC device. For example, the binary image can be one of the example binary images 300 in FIG. 3. In some embodiments, executing the random tests for multiple passes may include changing logical role of each processing core between subsequent passes, as described with reference to FIG. 4. For example, changing the logical role of each processing core may correspond to executing by that processing core different code in each pass that was executed by another processing core in the previous pass.

In step 508, the method includes comparing results of the multiple passes to detect the hardware error in the IC device. Comparing the results of the multiple passes may include comparing respective results from each pass between different processing cores. In some examples, comparing the results of the multiple passes may include storing a result of executing a first pass of the multiple passes, and comparing results of subsequent passes with the result of the first pass.

As described with reference to FIG. 4, results of the first pass can be saved as golden results, e.g., values of memory, registers, or other resources. The error detection may be performed by comparing the golden results saved from the first pass with the results of each of the second, third, and fourth passes of the test execution to detect the hardware errors based on any inconsistencies identified during the comparison. In some examples, the error detection core may receive a notification from other processing cores upon detection of the hardware error, which can be used to halt the host system performing the method.

In various embodiments, a maximal utilization of the system can be provided by performing the test generation 206, test execution 208, and error detection 210 automatically to generate multiple sets of random tests to detect the hardware errors, which can avoid loading time of the tests. In some embodiments, the set of random tests can be executed in a bare-metal mode of the IC device. In the bare-metal mode, the executable binary image 200 may utilize all of the processing cores of the IC device, and can allow the test generator to have the complete control of the IC device. The application-level mode can allow the test-generator to run as an application on the IC device by utilizing only a subset of the processing cores of the IC device.

Thus, the techniques described herein can be used to detect hardware errors in the IC devices using directed random tests that can be generated on-target, and have the advantage of being non-exhaustive while being directed to a certain error prone area. New test templates can be defined to cover different scenarios that can be used to generate additional sets of random tests. Each set of random tests can be executed as a binary image, and a multi-pass consistency checking method can be employed to detect the hardware errors by executing each binary image for M number of passes. The multi-pass checking method can provide better detection of the SDCs, which can be indeterministic in nature. Furthermore, using a different permutation of the physical processing cores for executing random code in each pass can expose a defective processing core, and provide better coverage for detection of the hardware errors. Various embodiments can provide flexibility in testing the IC device in the bare-metal mode or the application-level mode based on the configuration of the system.

Figure 6:
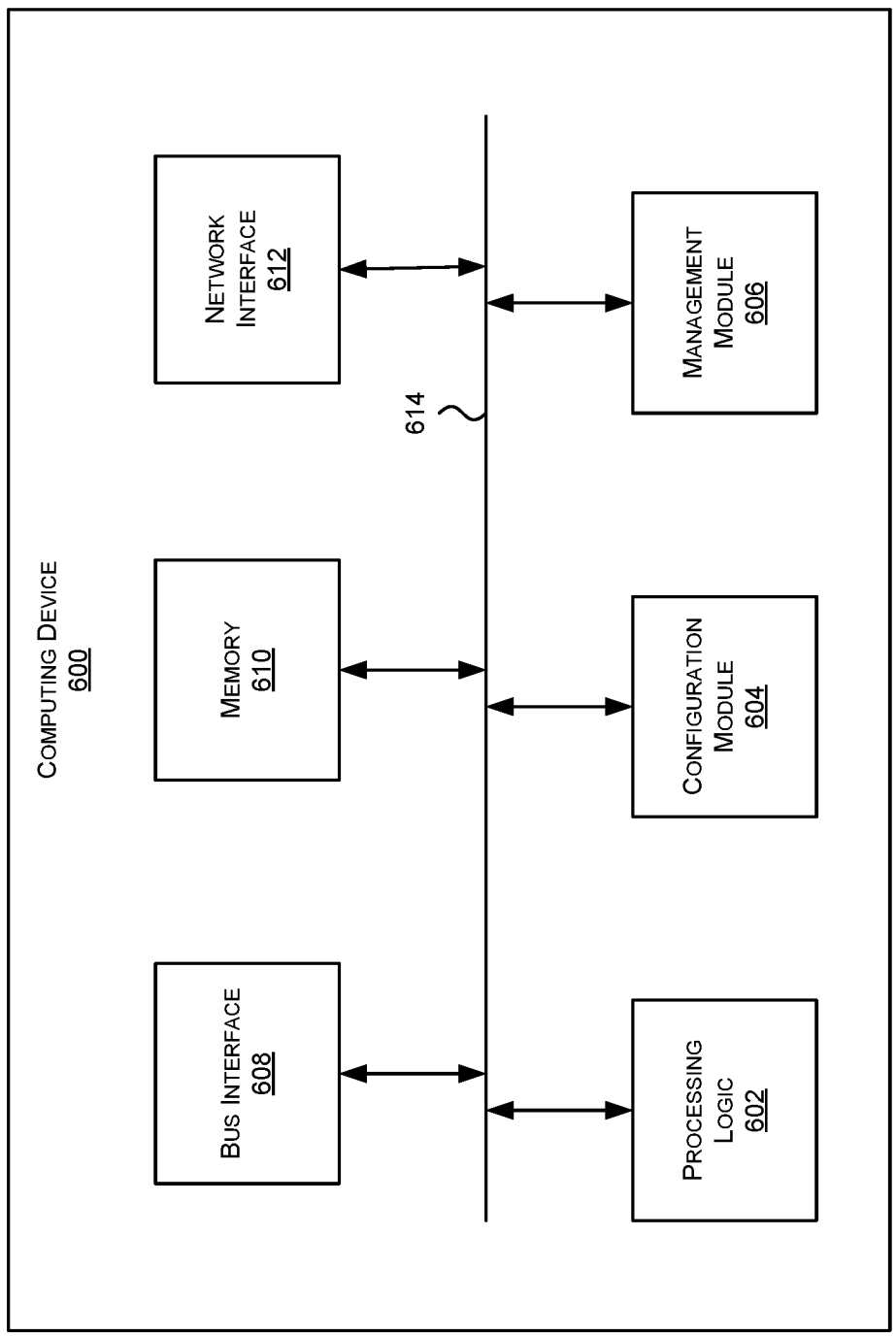
FIG. 6 illustrates an example of a computing device, according to certain aspects of the disclosure.

FIG. 6 illustrates an example of a computing device 600. Functionality and/or several components of the computing device 600 may be used without limitation with other embodiments disclosed elsewhere in this disclosure, without limitations. The computing device 600 can be an example of the IC device described with reference to previous figures. In some implementations, the computing device 600 can be part of a host system configured to perform testing on the IC device to detect hardware errors.

In one example, the computing device 600 may include processing logic 602, a configuration module 604, a management module 606, a bus interface module 608, memory 610, and a network interface module 612. These modules may be hardware modules, software modules, or a combination of hardware and software. In certain instances, modules may be interchangeably used with components or engines, without deviating from the scope of the disclosure. The computing device 600 may include additional modules, not illustrated here. In some implementations, the computing device 600 may include fewer modules. In some implementations, one or more of the modules may be combined into one module. One or more of the modules may be in communication with each other over a communication channel 614. The communication channel 614 may include one or more busses, meshes, matrices, fabrics, a combination of these communication channels, or some other suitable communication channel.

The processing logic 602 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 602 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 602 may be stored on a computer-readable storage medium, for example, in the form of a computer program. The computer-readable storage medium may be non-transitory. In some cases, the computer-readable medium may be part of the memory 610.

The memory 610 may include either volatile or non-volatile, or both volatile and non-volatile types of memory. The memory 610 may, for example, include random access memory (RAM), read only memory (ROM), Electrically Erasable Programmable Read-Only Memory (EEPROM), flash memory, and/or some other suitable storage media. In some cases, some or all of the memory 610 may be internal to the computing device 600, while in other cases some or all of the memory may be external to the computing device 600. The memory 610 may store an operating system comprising executable instructions that, when executed by the processing logic 602, provides the execution environment for executing instructions providing networking functionality for the computing device 600. The memory may also store and maintain several data structures and routing tables for facilitating the functionality of the computing device 600.

In some implementations, the configuration module 604 may include one or more configuration registers. Configuration registers may control the operations of the computing device 600. In some implementations, one or more bits in the configuration register can represent certain capabilities of the computing device 600. Configuration registers may be programmed by instructions executing in the processing logic 602, and/or by an external entity, such as a host device, an operating system executing on a host device, and/or a remote device. The configuration module 604 may further include hardware and/or software that control the operations of the computing device 600.

In some implementations, the management module 606 may be configured to manage different components of the computing device 600. In some cases, the management module 606 may configure one or more bits in one or more configuration registers at power up, to enable or disable certain capabilities of the computing device 600. In certain implementations, the management module 606 may use processing resources from the processing logic 602. In other implementations, the management module 606 may have processing logic similar to the processing logic 602, but segmented away or implemented on a different power plane than the processing logic 602.

The bus interface module 608 may enable communication with external entities, such as a host device and/or other components in a computing system, over an external communication medium. The bus interface module 608 may include a physical interface for connecting to a cable, socket, port, or other connection to the external communication medium. The bus interface module 608 may further include hardware and/or software to manage incoming and outgoing transactions. The bus interface module 608 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 608 may include the physical layer for any of these bus protocols, including a connector, power management, and error handling, among other things. In some implementations, the computing device 600 may include multiple bus interface modules for communicating with multiple external entities. These multiple bus interface modules may implement the same local bus protocol, different local bus protocols, or a combination of the same and different bus protocols.

The network interface module 612 may include hardware and/or software for communicating with a network. This network interface module 612 may, for example, include physical connectors or physical ports for wired connection to a network, and/or antennas for wireless communication to a network. The network interface module 612 may further include hardware and/or software configured to implement a network protocol stack. The network interface module 612 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 600 may include multiple network interface modules, each configured to communicate with a different network. For example, in these implementations, the computing device 600 may include a network interface module for communicating with a wired Ethernet network, a wireless 802.11 network, a cellular network, an Infiniband network, etc.

The various components and modules of the computing device 600, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 6, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method for detecting hardware errors in an integrated circuit (IC) device that includes a plurality of processing cores, comprising:
   generating a plurality of test templates, wherein each test template includes a set of instructions to create scenarios for detection of the hardware errors;
   periodically generating a binary image that includes a plurality of random tests corresponding to the plurality of test templates; and
   for each binary image:
      executing the binary image on the IC device for a first pass;
      storing a result of the first pass as a golden result;
      executing the binary image on the IC device in subsequent passes by changing logical roles of which processor core executes which test in each pass to have each processor core execute a test previously executed by another processor core; and
      comparing results of the subsequent passes against the golden result to detect a hardware error in the IC device.

2. The method of claim 1, wherein the binary image is executed on the IC device in a bare-metal mode that utilizes all of the processing cores of the IC device.

3. The method of claim 1, wherein the binary image is executed on the IC device in an application-level mode that utilizes a subset of the processing cores of the IC device.

4. The method of claim 1, wherein the hardware error being detected is a manufacturing defect, or an error resulting from an operating environment or aging of the IC device.

5. A computer-implemented method, comprising:
   generating a plurality of test templates to perform testing on an integrated circuit (IC) device having multiple processing cores to detect a hardware error;
   generating a set of random tests corresponding to the plurality of test templates;
   executing the set of random tests on the IC device for multiple passes by changing logical roles of which processing core executes which test between subsequent passes to have each processor core execute a test previously executed by another processor core; and
   comparing results of the multiple passes to detect the hardware error in the IC device.

6. The computer-implemented method of claim 5, further comprising:
   generating multiple sets of random tests, wherein each set of random tests corresponds to the plurality of test templates; and
   executing each set of random tests on the IC device for the multiple passes.

7. The computer-implemented method of claim 6, wherein each set of random tests is generated as a binary image for execution on the IC device.

8. The computer-implemented method of claim 5, wherein each test template includes a set of instructions, and generating a random test for a test template includes one or more of randomly selecting instructions from the set of instructions, randomizing a sequence of instructions in the set of instructions, or randomizing input values for instructions in the set of instructions.

9. The computer-implemented method of claim 5, wherein comparing the results of the multiple passes includes:
   storing a result of executing a first pass of the multiple passes; and
   comparing results of subsequent passes with the result of the first pass.

10. The computer-implemented method of claim 5, wherein comparing the results of the multiple passes includes comparing respective results from each pass between different processing cores.

11. The computer-implemented method of claim 5, wherein the plurality of test templates are configured to test one or more of floating-point computations, execution pipeline, frequency changes, or instruction branches.

12. The computer-implemented method of claim 5, wherein the set of random tests is executed in a bare-metal mode of the IC device.

13. The computer-implemented method of claim 5, wherein the set of random tests is executed in an application-level mode of the IC device.

14. The computer-implemented method of claim 5, wherein changing the logical roles between the subsequent passes includes designating which processing core is used as an error detection core.

15. The computer-implemented method of claim 14, wherein the error detection core receives a notification upon detection of the hardware error to halt a host system of the IC device.

16. A non-transitory computer readable medium having stored therein instructions that, when executed by one or more processors, cause the one or more processors to perform operations including:
   generating a plurality of test templates to perform testing on an integrated circuit (IC) device having multiple processing cores to detect a hardware error;
   generating a set of random tests corresponding to the plurality of test templates;
   executing the set of random tests on the IC device for multiple passes by changing logical roles of which processing core executes which test between subsequent passes to have each processor core execute a test previously executed by another processor core; and
   comparing results of the multiple passes to detect the hardware error in the IC device.

17. The non-transitory computer readable medium of claim 16, wherein each test template includes a set of instructions, and generating a random test for a test template includes one or more of randomly selecting instructions from the set of instructions, randomizing a sequence of instructions in the set of instructions, or randomizing input values for instructions in the set of instructions.

18. The non-transitory computer readable medium of claim 16, wherein comparing the results of the multiple passes includes:
   storing a result of executing a first pass of the multiple passes; and
   comparing results of subsequent passes with the result of the first pass.

19. The non-transitory computer readable medium of claim 16, wherein the operations further include:
   generating multiple sets of random tests, wherein each set of random tests corresponds to the plurality of test templates; and executing each set of random tests on the IC device for the multiple passes.

20. The non-transitory computer readable medium of claim 16, wherein changing the logical roles between the subsequent passes includes designating which processing core is used as an error detection core.

* * * * *